United States Patent [19]

Gale et al.

[11] Patent Number: 4,839,145

[45] Date of Patent: Jun. 13, 1989

[54] CHEMICAL VAPOR DEPOSITION REACTOR

[75] Inventors: Ronald P. Gale, Sharon; John C. C. Fan, Chestnut Hill, both of Mass.

[73] Assignee: Massachusetts Institute of Technology, Cambridge, Mass.

[21] Appl. No.: 900,886

[22] Filed: Aug. 27, 1986

[51] Int. Cl.$^4$ ............................................. C30B 35/00
[52] U.S. Cl. .................................... 422/245; 118/725; 118/730
[58] Field of Search ................ 422/245; 118/715, 719, 118/720, 724, 725, 728, 730, 729; 156/613

[56] References Cited

U.S. PATENT DOCUMENTS

| | | | |
|---|---|---|---|
| 3,594,227 | 7/1971 | Oswald | 118/730 |
| 3,641,974 | 2/1972 | Yamada et al. | 118/730 |
| 3,696,779 | 10/1972 | Murai et al. | 118/730 |
| 4,018,184 | 4/1977 | Nagasawa et al. | 118/715 |
| 4,279,669 | 7/1981 | Braun et al. | 156/613 |
| 4,368,098 | 1/1986 | Manasevit | 156/606 |
| 4,404,265 | 9/1983 | Manasevit | 428/689 |
| 4,465,416 | 8/1984 | Burkhalter et al. | 118/729 |
| 4,468,283 | 8/1984 | Ahmed, I | 156/613 |
| 4,503,807 | 3/1985 | Nakayama et al. | 118/719 |
| 4,509,456 | 4/1985 | Kleinert et al. | 118/715 |
| 4,565,157 | 1/1986 | Brors et al. | 118/719 |
| 4,587,002 | 5/1986 | Bok | 118/715 |
| 4,606,935 | 8/1986 | Blum | 118/719 |

FOREIGN PATENT DOCUMENTS

| | | | |
|---|---|---|---|
| 0069874 | 6/1977 | Japan | 118/730 |
| 0049518 | 5/1981 | Japan | 118/730 |
| 0041842 | 3/1984 | Japan | 118/715 |
| 0070760 | 4/1984 | Japan | 118/720 |
| 1017151 | 1/1986 | Japan | 118/715 |
| WO85/00716 | 4/1985 | PCT Int'l Appl. | 29/267 |

OTHER PUBLICATIONS

Leys et al., "Growth of Multiple Thin Layer Structures . . .", J. Crys. Growth 68 (1984) 431–436.

Silvestri, V., "Apparatus for the Introduction of Substrates into a Vapor Deposition System", IBM Tech. Discl. Bul. vol. 8, No. 5, 10/65.

Whitner, R., "Apparatus for the Deposition of Silicon Nitride", Technical Digest No. 11, Jul. 1968, pp. 5–6, Western Electric Co.

"A New Method for the Growth of GaAs Epilayer at Low $H_2$ Pressure", Duchemin et al., *Journal of Crystal Growth* 45 (1978) 181–186.

Primary Examiner—John Doll
Assistant Examiner—R. Bruce Breneman
Attorney, Agent, or Firm—Hamilton, Brook, Smith & Reynolds

[57] ABSTRACT

A reactor, suitable for CVD processes, which presents a high aspect ratio to reactant gasses, is described. Substrates are mounted on oppositely disposed susceptors in a vertical chimney-type reactor. Means are provided to rotate the susceptors about an axis perpendicular to gas flow. Side-loading or top-loading mechanisms are provided for loading and unloading the susceptors through a gate valve. A diffuser below the reaction zone adjusts the gas flow into the reaction zone.

34 Claims, 13 Drawing Sheets

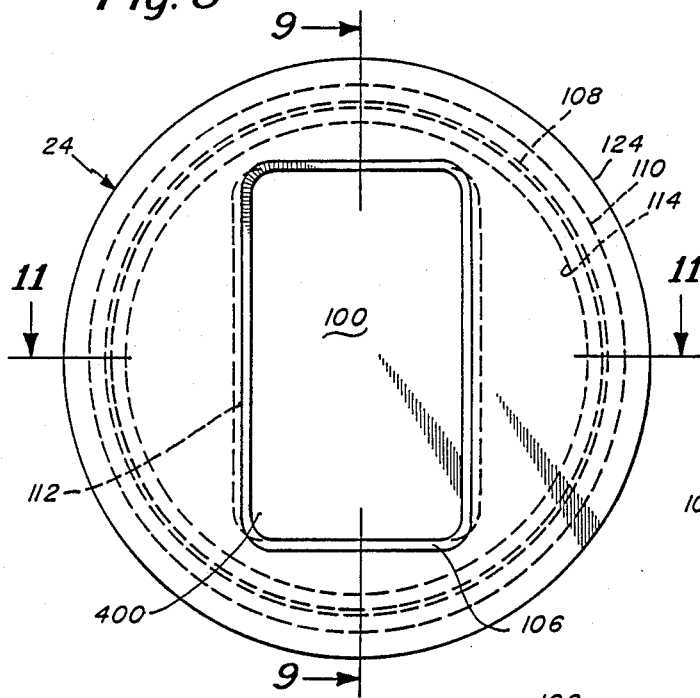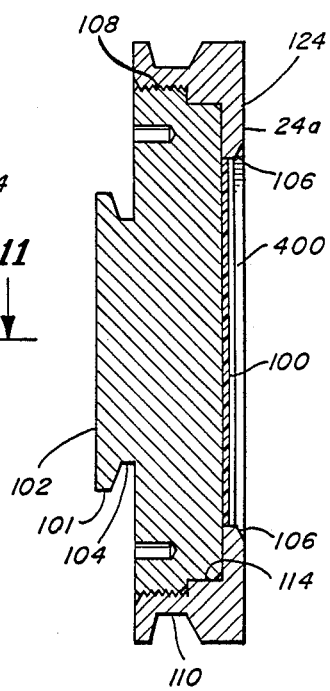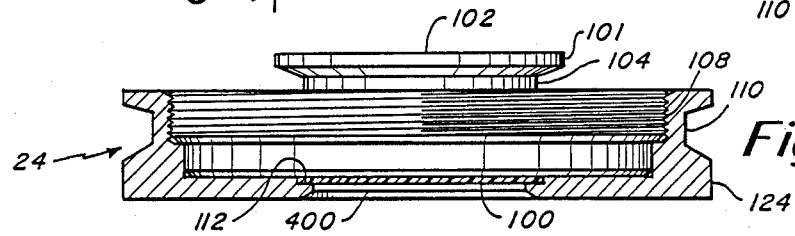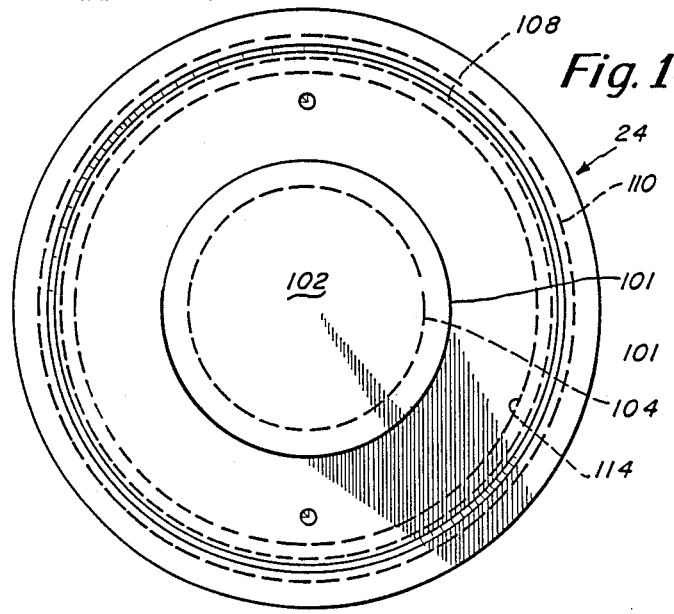

CHEMICAL VAPOR DEPOSITION REACTOR

The Government has rights in this invention pursuant to Grant Number F19628-85-C-002 awarded by the Department of the Air Force.

TECHNICAL FIELD

This invention is in the field of chemical vapor deposition (CVD) reactors.

BACKGROUND ART

Manasevit, in U.S. Pat. Nos. 4,404,265 and 4,368,098, describes a basic organometallic chemical vapor deposition (OMCVD) process for forming thin films of single crystal Group III-V wide band-gap semiconductor compounds or alloys on single crystal heated substrates. In general, OMCVD involves the pyrolysis of metal alkyls containing a Group III constituent with hydrides containing a Group V constituent. For example, alkyl metal organics or organo-metallics, such as trimethylgallium (TMG) and/or triethylgallium (TEG) are reacted with a Group V hydride, such as arsine or phosphine or stibnine, to form a GaAs or GaP or GaSb film on a suitable substrate.

Manasevit also describes the background for the development of OMCVD processes. As microelectronic technology evolved, the search for better semiconductor materials became more intense. In the past, most process technology concentrated on the use of single element germanium or silicon for the formation of semiconductor devices. More recently, other semiconductor materials, such as gallium arsenide, have became increasingly important. Gallium arsenide (GaAs) and other III-V semiconductor compounds and alloys have been found to be among the most versatile of all semiconductor materials. For example, varactors, transistors, microwave diodes, light-emitting diodes, injection lasers, bulk microwave power sources, negative resistance amplifiers, and bulk-effect integrated circuits are all possible with gallium arsenide.

Although GaAs, Ge and Si all exhibit semiconducting properties, the differences between GaAs and the elemental semiconductors Ge and Si enhance gallium arsenide's potential usefulness. In GaAs, the minimum of the conduction band and the maximum of the valence band are such that direct electronic transitions can occur between the bands, allowing gallium arsenide to be used, for example, as an injection laser. This is not true for silicon or germanium.

Gallium arsenide has a higher electron mobility and a wider band gap than either germanium or silicon. Furthermore, GaAs has two valleys in its conduction band, separated by an energy difference. Electrons in the lower-energy valley have a higher mobility than those in the higher-energy valley. As the voltage across a sample of GaAs is increased, more electrons are excited into the upper, lower mobility valley and the current decreases, causing bulk instabilities such as the Gunn effect. This permits GaAs to be used for microwave power sources of types not possible for either silicon or germanium.

In the past, the primary obstacle to more extensive exploitation of GaAs has been its relative impurity compared with either germanium or silicon. Because of this impurity problem, high quality transistors could not be fabricated with previously available GaAs materials.

Two methods of crystal growth, the Czochralski and the horizontal Bridgman, had been used to grow bulk single crystal GaAs of relatively high purity from a melt. However, to obtain optimum purity, device-grade, gallium arsenide, growth from the vapor phase is a preferred method.

Attempts to grow GaAs in the vapor phase prior to OMCVD had various shortcomings. First, the techniques required the use of reaction chambers in which two or more regions of the chamber are heated to different, closely controlled temperatures. Such a multiple temperature requirement is difficult to implement in a production facility. Further, the prior art techniques each require use of gallium metal as a source material present in the deposition chamber. Gallium metal is difficult to obtain free of impurities because of its reactivity at high temperature with its container, and these impurities tend to vaporize in the chamber and contaminate the deposited GaAs film.

Two general types of OMCVD reactors have been developed; horizontal and vertical reactors. High quality thin GaAs epilayers have been grown in small volume, laboratory conditions using horizontal cold-walled reactors in which a substrate is mounted on a tilted heated body, i.e., a susceptor, within an elongated quartz cylinder. The longitudinal axis of the cylinder is disposed perpendicular to the gravitational vector to form a horizontal reactor. The susceptor is heated by R.F. induction and a flow of organo-metallic reactants and hydrides is pumped through the reaction chamber. ["A New Method for the Growth of GaAs Epilayer at Low $H_2$ Pressure", Duchemin et al., *Journal of Crystal Growth* 45 (1978) pp. 181-186.]

A vertical reactor is shown in U. S. Pat. No. 4,368,098 to Manasevit. This reactor is a conventional "flow-down" vertical OMCVD reactor in which gaseous reactants flow downwardly past an R.F. heated susceptor, upon which a substrate is mounted.

A less conventional vertical "chimney" type reactor is described by Leys et al., in "Growth of Multiple Thin Layer Structures in the GaAs-AlAs System Using a Novel VPE Reactor", *Journal of Crystal Growth* 68 (1984) pp. 431-436. In the "chimney" type vertical reactor, the reactant gasses flow upwardly in the direction of the longitudinal axis of the reaction chamber which is parallel to the gravitational field vector. In Leys et al., reaction gasses are introduced at the bottom of the chamber and pass through a single hollow, vertical, pipe-shaped susceptor of rectangular cross-section. Substrates are attached to a pair of opposing inner walls of the susceptor. The susceptor is formed of graphite and heated by RF induction.

The conventional "flow down" reactor, as represented by Manasevit's vertical reactor, and the horizontal type reactor of Duchemin et al. suffer from serious thermal instability problems. As the gasses heat up next to the susceptor, they expand. The resulting lowering of density creates a buoyancy effect in which the gas tends to rise in a direction contrary to the desired flow. The resultant flow is not conducive to the formation of abrupt interfaces.

In Ley et al's vertical flow-up system, this buoyancy effect helps to stabilize the gas flow and enables the reactor to grow layers with very abrupt interfaces. This is an advantageous effect for high electron mobility transistors, heterojunction bipolar transistors, and heterostructure devices, in general. However, Leys et al's reactor also produces horizontal thermal gradients.

These thermal gradients occur because the bulk of the reactant gasses flow up the cooler central core of the reactor. The resultant flow non-uniformities may be the cause of the large lateral non-uniformity in growth that has been reported by Leys et al.

Attempts to scale-up laboratory OMCVD reactors, be they vertical or horizontal types have met with difficulties, chiefly a loss of uniformity of growth resulting from the increased length of the reaction zone. Efforts to compensate for such non-uniformity have included rotation of the substrate about an axis which is parallel or closely parallel to the flow of reactant gas, or narrowing of the gas flow channel in the longitudinal direction. The former effort fails to address longitudinal non-uniformity due to reactant gas depletion. The latter effort is only practical for short lengths of growth regions and is therefore unsuitable for scale-up.

DISCLOSURE OF THE INVENTION

The invention, in general, relates to a vertical reaction chamber for CVD or OMCVD. The term CVD is intended to include, without limitation, chemical vapor deposition of dielectric films, metal films, or semiconductive films. Also, while the term OMCVD is used herein, the OMCVD process is sometimes referred to as MOCVD for Metalorganic Chemical Vapor Deposition, or, since the emphasis is on epitaxial growth, OMVPE, for Organometallic Vapor Phase Epitaxy.

The apparatus of the invention comprises, in general, a reaction chamber for heating reacting gasses with a pair of opposing heated susceptors which form an inner reaction region or zone within the chamber having a high "aspect ratio". Substrate(s) are mounted on one or both of the susceptors. The susceptors are rotatable about an axis perpendicular to gas flow. The rotatable susceptors are mounted on opposite walls of a centrally located partition. The substrate(s) have a growth surface exposed to the reaction zone through an opening in the vertical walls. Reaction gasses are introduced through a diffuser plate located below the walled partition. The diffuser plate permits a greater flow of gas near the periphery of the reaction chamber than at the axial center. This flow distribution compensates for the gas velocity distribution which is the cause of lateral non-uniformity. Means are provided to exhaust the reaction gasses. An intermediate region is provided adjacent the centrally located walled partition to provide access for removably mounting the rotatable substrate/susceptor assembly.

The term "aspect ratio" as used above, is intended to define the ratio of the lateral width of the susceptors to the distance between the susceptors. In accordance with the invention, a relatively large ratio, at least substantially greater than one, is preferable. A large aspect ratio results in efficient utilization of the reacting gasses since the gasses flow through a relatively narrow channel. The narrow reaction zone presented by the high aspect ratio contributes to thermal uniformity. Also, the gasses are exposed to hot-walled susceptors on both sides; rather than one hot wall and one cold wall in the conventional single susceptor reaction chambers.

It is also desirable to have the distance between susceptors be less than or equal to one inch and the lateral width, or diameter, of the susceptors greater than two inches.

In a first embodiment, the chamber comprises an outer walled envelope, an intermediate walled partition within the outer envelope, and an inner walled partition within the intermediate partition.

The outer walled envelope is comprised of a tubular longitudinally extending quartz side wall and upper and lower stainless steel end plates.

The intermediate walled partition is comprised of a longitudinally extending tubular quartz segment open at the upper end and concentric with the vertical longitudinal axis of the outer envelope. The intermediate walled partition defines an outermost exhaust region $R_o$ between the intermediate partition and the outer envelope wherein reactant gaseous by-products are exhausted out the envelope through exhaust openings in the lower end plates of the envelope.

The inner walled partition is a generally tubular longitudinally extending quartz segment open at the upper end and concentric with the vertical axis of the envelope. The inner partition is disposed coaxially within the intermediate partition. The inner walled partition has a generally rectangular cross-section with a narrow space between and a wide width forming a large aspect ratio section. An intermediate region $R_{int}$ forms a gas purge and access zone defined between the inner walled partition and the intermediate partition. Purge gasses are introduced at a lower portion of the intermediate region and exit at the upper end of the intermediate region. The opposing vertical walls of the inner walled partition define an innermost region $R_{in}$ wherein the reaction gasses flow. Reactant gasses are introduced to the innermost region through a diffuser plate at the lower end of the innermost region.

Two rotatable susceptors are mounted in each of two opposing vertical walls of the inner and outer partition. Each susceptor has a substrate wafer vertically disposed on the susceptor. An external planar surface of the substrate is exposed to the innermost reaction region through an opening in the vertical wall of the inner partition accessible through a back wall of the susceptor; when the susceptor is removed from the chamber. This back-entry system enables the distance between susceptors to be relatively small; yet access is provided for removing and mounting substrates. The OMCVD reaction zone is located between the two surfaces of the semiconductor wafers.

The susceptor is adapted for rotational movement in a plane substantially parallel to the flow of the reactant gasses, or, in other words, about an axis perpendicular to the flow of reactant gasses. Preferably, the rectangular cross-section defining the innermost region has an aspect ratio ranging from at least 3 to over 20, to provide large growth area reactor zones. Above the upper end plate of the reactor envelope, a gate valve is provided to allow loading and unloading of the susceptors from above.

Rotation of the susceptors in a plane substantially parallel to the flow of reactant gasses permits averaging of the spatial variations in the reactant gas flow, thereby preventing such spatial variations from contributing to non-uniformities in the deposited layers.

The substrates are held securely by the susceptors through the use of a screw plug retainer mechanism. Each susceptor is comprised of a large, circular or rectangular disk with holes in which the substrates are placed. Screw plugs press on each substrate from behind. The front surfaces of the substrates are held substantially flush with the susceptor surface by a thin narrow ridge on the front of the susceptor.

As previously noted, the large aspect ratio of the deposition zone; defined by the ratio of the width of two relatively large susceptors to the lateral transverse distance between the wafers, presents a geometry that minimizes the thermal gradients normal to the susceptors, thereby assuring almost complete reaction of the reactant source gasses. Additionally, because of the high aspect ratio, all the reaction gasses are in close proximity to the heated susceptor and the wafers mounted thereon. This results in enhanced decomposition of the gasses which, in turn, enables the reactor to be capable of growing material at much lower growth temperatures; a highly desirable attribute, resulting in lower thermal stresses, lower autodoping effects, and generally lower power usage.

As will be seen in more detail in connection with the drawings, the apparatus of the present invention overcomes the uniformity problems prevalent in scaling up for large area deposition. In the apparatus of the present invention, rotation in a plane substantially parallel to the flow of reactant gasses alternately carries the substrates upstream and downstream in the gas flow allowing the deposition to represent an average of the gas conditions over the entire deposition area.

In a preferred embodiment of the invention, the substrates are manually mounted on the susceptors outside of the reactor and then automatically loaded into a vertically rotatable position in the reactor by means of a crane mechanism, thereby allowing the entire loading and unloading sequence of substrates to be performed completely by robotics. This automatic handling capability also allows the reactor to be part of a multi-reaction chamber system with different deposition processes taking place in different systems. The pairs of susceptors can be mechanically moved from one chamber to another without handling and breaking the individual substrates. The susceptors thereby essentially act as a high-temperature substrate holder.

Another advantage of the present invention is the ability to clean the reactor using hydrogen chloride gas in the deposition reaction without use of an external oven. In conventional cold wall OMCVD reactors, the cold walls opposite the susceptor develop deposits that eventually interfere with the deposition. The apparatus of the present invention utilizes a hot walled deposition area which allows the etching of wall deposits by hydrogen chloride gas in and near the deposition area or region.

BRIEF DESCRIPTION OF THE DRAWINGS

FIG. 8 is a front elevation view of a rectangular wafer susceptor 24 and chip 100 of the invention.

FIG. 9 is a cross-sectional view taken along line 9—9 of FIG. 8 showing the details of the susceptor 24.

FIG. 10 is rear elevational view of a rectangular chip susceptor 24 in accordance with the invention.

FIG. 11 is a cross-sectional view taken along lines 11—11 of FIG. 8.

FIG. 17 is a sectional view taken along the lines 17—17 of FIG. 14 showing the crane in the "jaws closed" position.

FIG. 18 is a sectional view taken along the lines 18—18 of FIG. 17 showing the crane in the "jaws open" position.

DETAILED DESCRIPTION OF THE INVENTION

A preferred embodiment of the invention will now be described, in detail, in connection with the drawings.

I. GENERAL DESCRIPTION

Figure 1:
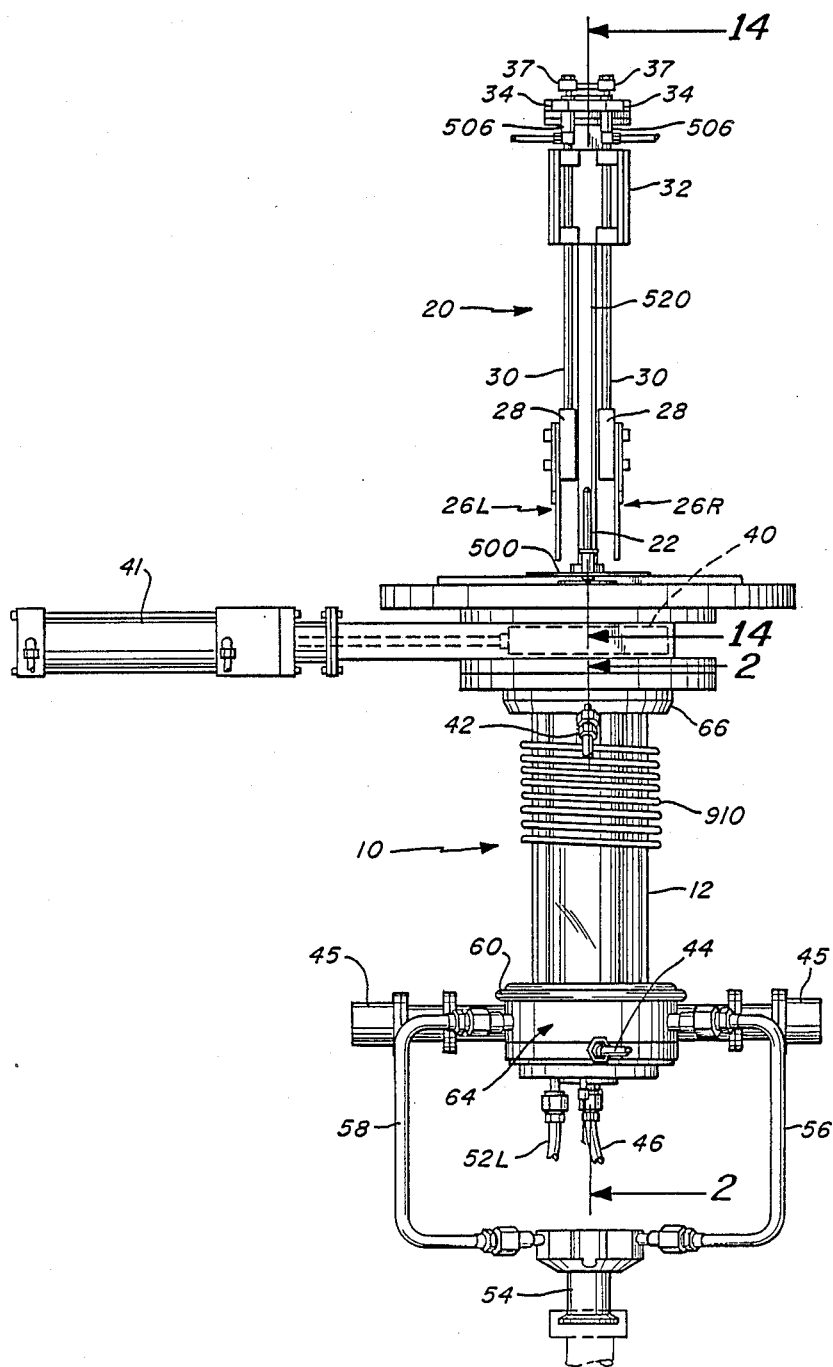
FIG. 1 is a side elevational view of a reactor and accessories in accordance with the invention.

Referring now to FIG. 1, there is shown an elevational view of the apparatus of the invention which may be seen to generally comprise three main assemblies; a crane assembly 20 for lowering and inserting susceptors through a gate valve assembly 40 into a reactor assembly 10. The apparatus of the preferred embodiment of the invention is adapted to be mounted in the vertical position, that is, with the longitudinal axis of the reactor tube 12 aligned with the gravitational vector.

Reactant gasses are introduced into the reaction chamber via inlet 44 on lower cover assembly 64. Purge gasses are introduced via purge gas lines 46 and 42 and exhaust gas is extracted from the reaction chamber via exhaust lines 56 and 58 coupled to exhaust manifold 54.

Tubes 60, provided with coolant, are affixed around the periphery of lower cover assembly 64. An outer envelope of quartz or other suitable material 12 extends from lower cover assembly 64 to upper cover assembly 66. A port 42 is provided on cover 66 for introduction of $H_2$ purge gas to keep the gate valve clean. Upper and lower seal ports 52U and 52L (FIG. 2) in conjunction with double O-Ring seals 520 on respective cover 66 and 64, provide a vacuum seal as a back-up seal between the cover assemblies and the quartz envelope 12.

Intermediate reactor tube 14 is supported within the reactor assembly 10 and extends longitudinally within outer envelope 12 to within a short distance from the upper cover assembly 66, providing a path between the intermediate reactor tube 14 and the outer envelope 12 for the flow of exhaust gasses back to exhaust lines 56 and 58.

II. REACTOR ASSEMBLY

Figure 2:
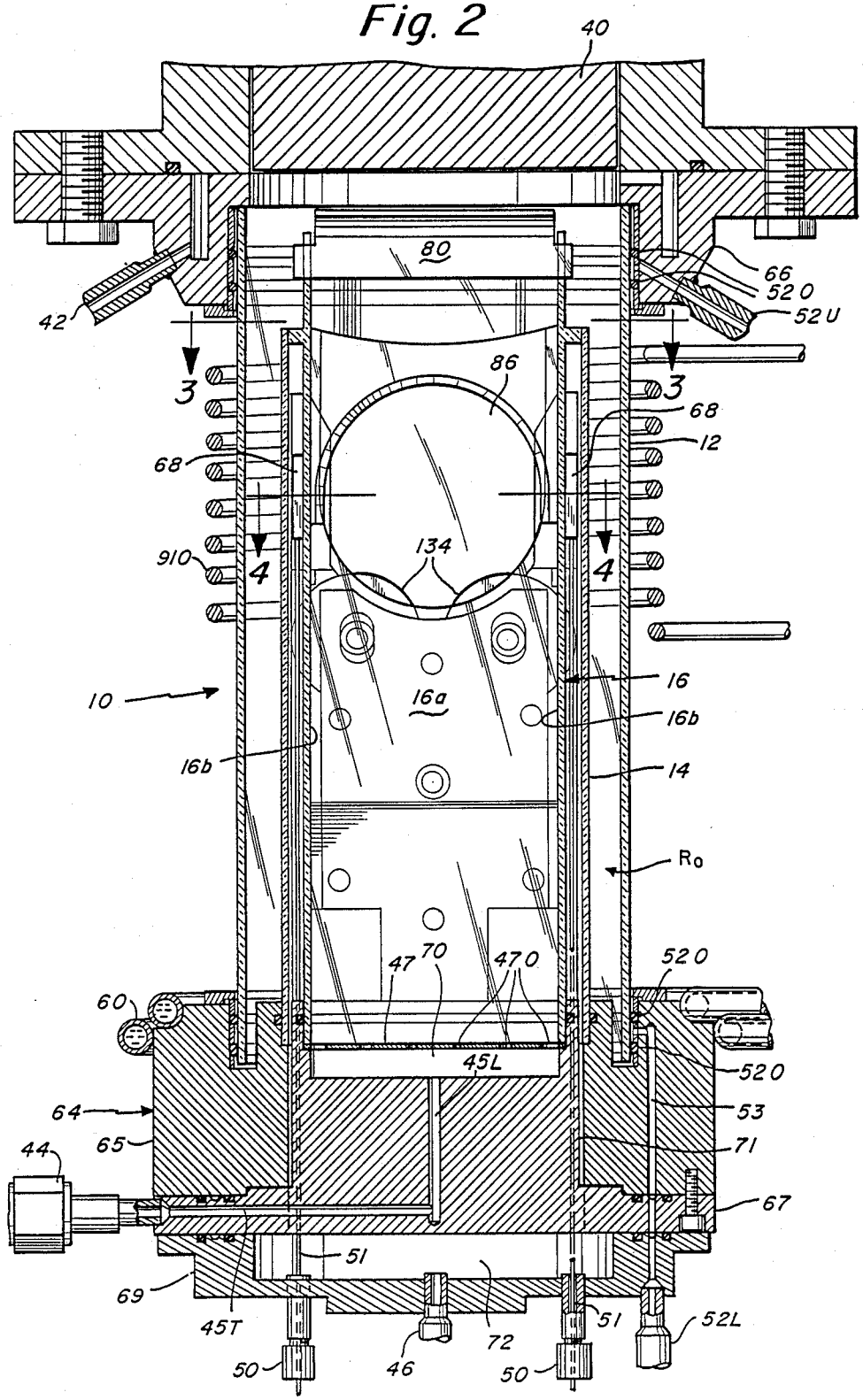
FIG. 2 is a cross-sectional view of the reactor chamber portion 10 of the invention taken along lines 2—2 of FIG. 1.
Figure 3:
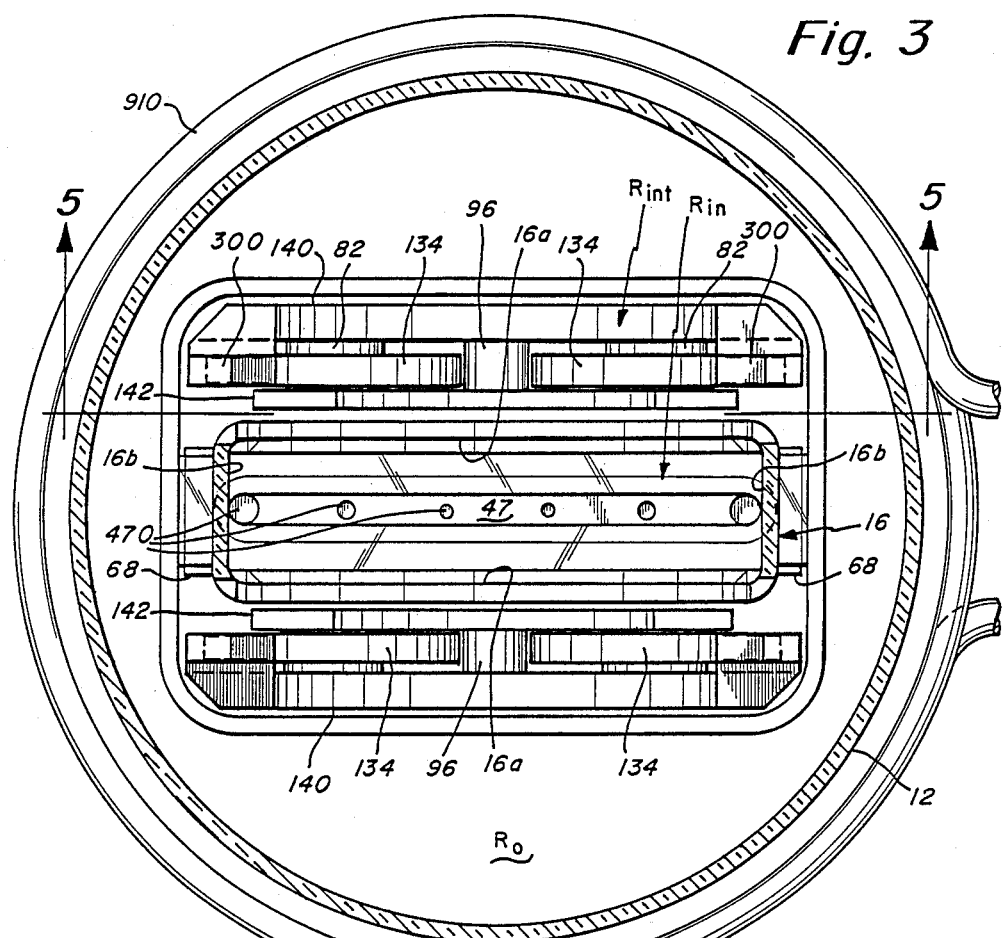
FIG. 3 is a cross-sectional view of the reactor 10 taken along lines 3—3 of FIG. 2.
Figure 4:
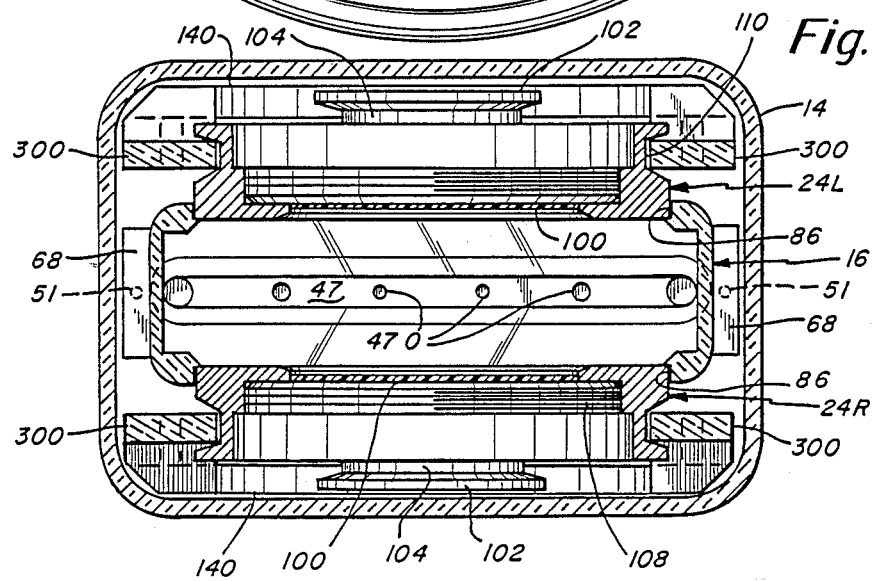
FIG. 4 is a cross-sectional view of the reaction region of the reactor taken along lines 4—4 of FIG. 2.

The details of the reactor assembly 10 will now be described in connection with FIGS. 2–7. Referring specifically to FIGS. 2–4, it may be seen that the reactor assembly 10, in general, comprises an outer circular quartz reactor tube 12 extending between two metallic cover plate assemblies, a lower cover plate assembly 64 and an upper cover plate assembly 66.

The upper cover plate assembly forms an upper end wall of the reactor chamber and the lower cover plate assembly forms a lower end wall of the reaction chamber. The quartz envelope 12 forms the side wall of the chamber. Within these chamber walls is disposed an intermediate walled partition 14 defining an outermost region $R_o$ between the intermediate partition and the side wall or envelope 12.

The inner walled partition or inner reactor tube 16, as shown more clearly in FIGS. 3 and 4, to comprise opposing pairs of side walls 16a and 16b, with the side walls 16a being substantially greater in width than the side walls 16b. A generally rectangular cross-sectional zone is formed between the walls of inner partition 16, which cross-section defines an innermost region $R_{in}$ between the walls; within which the CVD reaction occurs.

Figure 6:
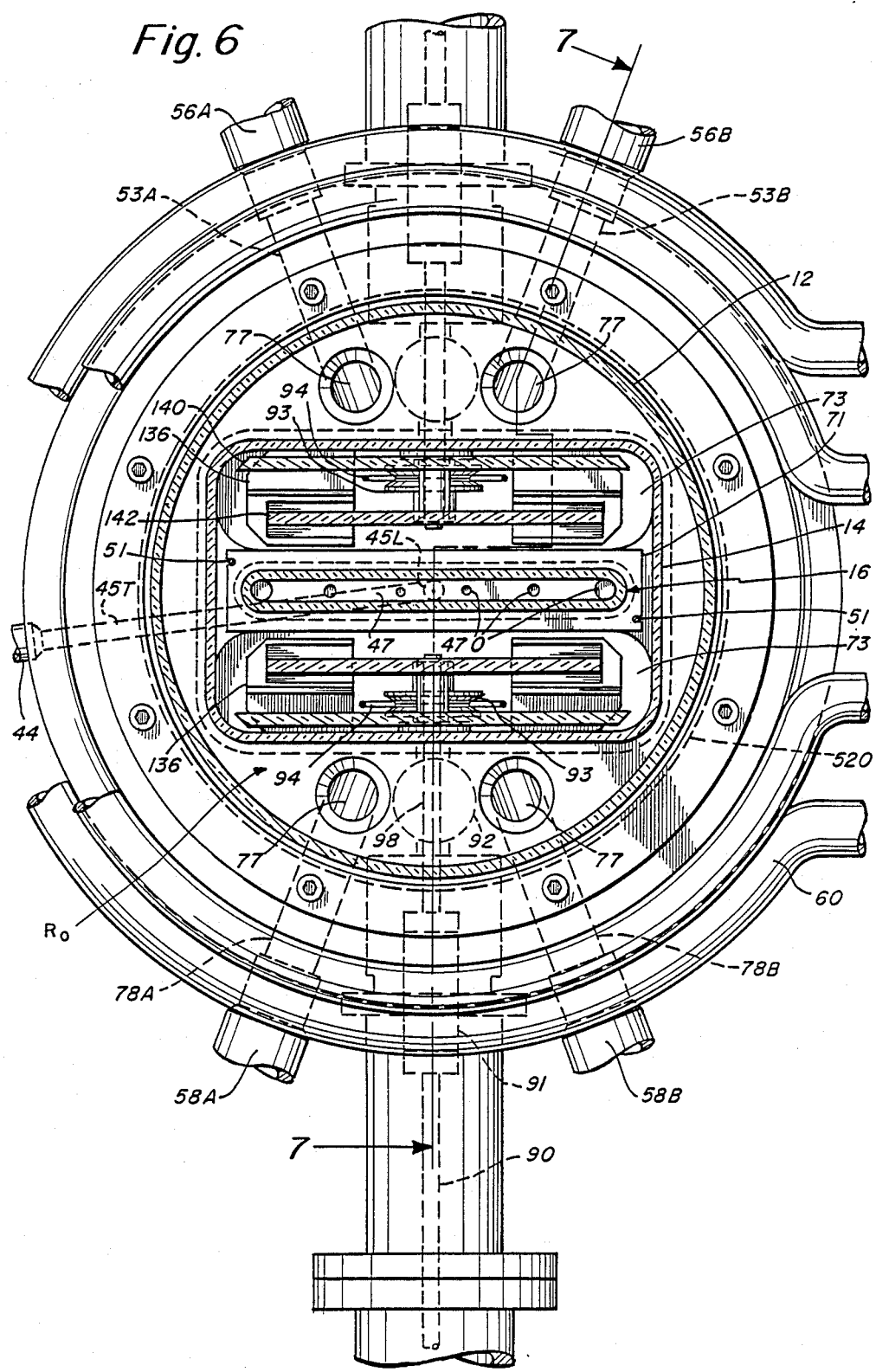
FIG. 6 is a cross-sectional view taken along lines 6—6 of FIG. 5.

The space between the inner reactor tube 16 and the intermediate reactor tube 14 defines an intermediate region $R_{int}$ wherein purge gas may be introduced via gas inlet 46 (See FIG. 7) into chamber 72, through slot 73 in cylindrical block body 67, up through the intermediate region $R_{int}$ between the outer walled surface of inner reactor tube 16 and the inner walled surface of intermediate reactor tube 14. The purge gasses meet with the unreacted gas deflected by deflector 80 and are swept away by the exhaust gasses down through the outermost region $R_o$ in the direction of the arrows shown in FIG. 7, out exhaust bores 77 through exhaust ports 58A and 58B and 56A and 56B (FIG. 6).

Lower cover assembly 64 is comprised of a coaxial outer ring 65 (See FIGS. 5 and 7) upon which is affixed cooling coil 60, for maintaining a reduced temperature at the seal between ring 65 and envelope 12. An intermediate cylindrical block body 67 is provided with an axially extending bore 45L (See FIG. 2) connecting to a transverse bore 45T which is coupled to inlet port 44 to provide for the flow of reactant gasses into the innermost region $R_{in}$. Cylindrical block body 67 has a rectangular block protrusion 71 on its top surface which supports reactor tube 16 and has an O-ring seal therebetween Manifold 70 is formed in body 67 and is connected to bore 45L. As shown more clearly in FIG. 7, bore 45L communicates with the lower radially tapered extension of inner reactor tube 16, through manifold 70 and openings 470 in diffuser plate 47.

As shown in FIG. 3, these openings are progressively smaller in diameter extending from the outer radial direction inwardly. This enables an initial greater flow of gas at the extremities to compensate for the greater inner velocity caused by the "chimney" effect draft of the upward flowing gasses. Thermocouple wires 51, shown in FIG. 2, extend from connectors 50 through a lower ring 69 affixed to lower plate assembly 64 and are coupled to thermocouple blocks 68 mounted on side wall 16b of inner reactor tube 16, thereby providing a convenient means for monitoring the temperature near the innermost reaction region $R_{in}$.

Figure 7:
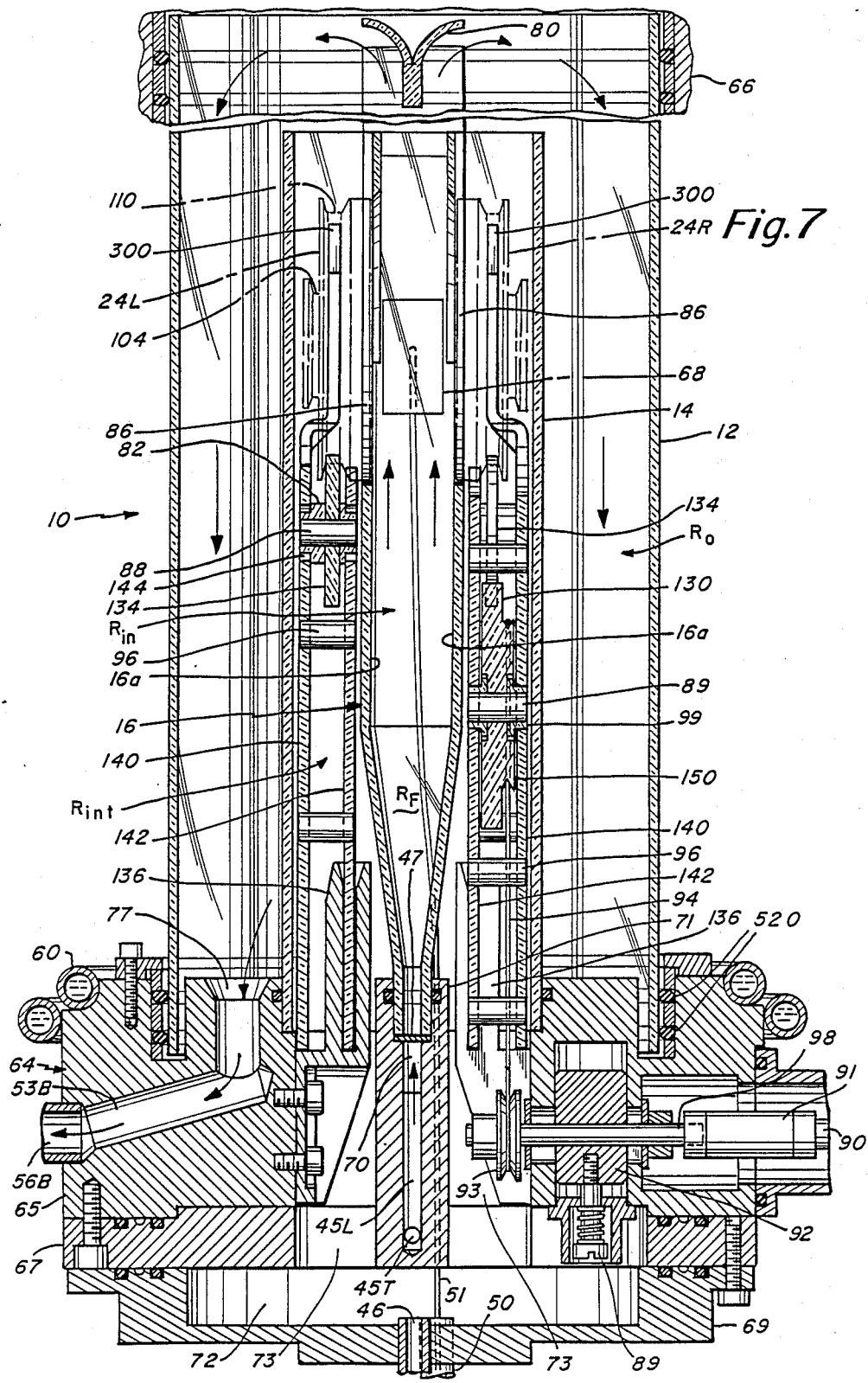
FIG. 7 is a cross-sectional view taken along lines 7—7 of FIG. 6.

Purge gas inlet port 46 communicates with purge gas manifold 72, as shown in FIGS. 2 and 7. As shown in FIG. 6, pairs of exhaust ports 56A and 56B and 58A and 58B extend through respective bores 53A and 53B and 78A and 78B in lower plate assembly 64 and communicate with the outermost region $R_o$ between outer envelope 12 and intermediate tube 14.

III. DRIVE ASSEMBLY

Figure 5:
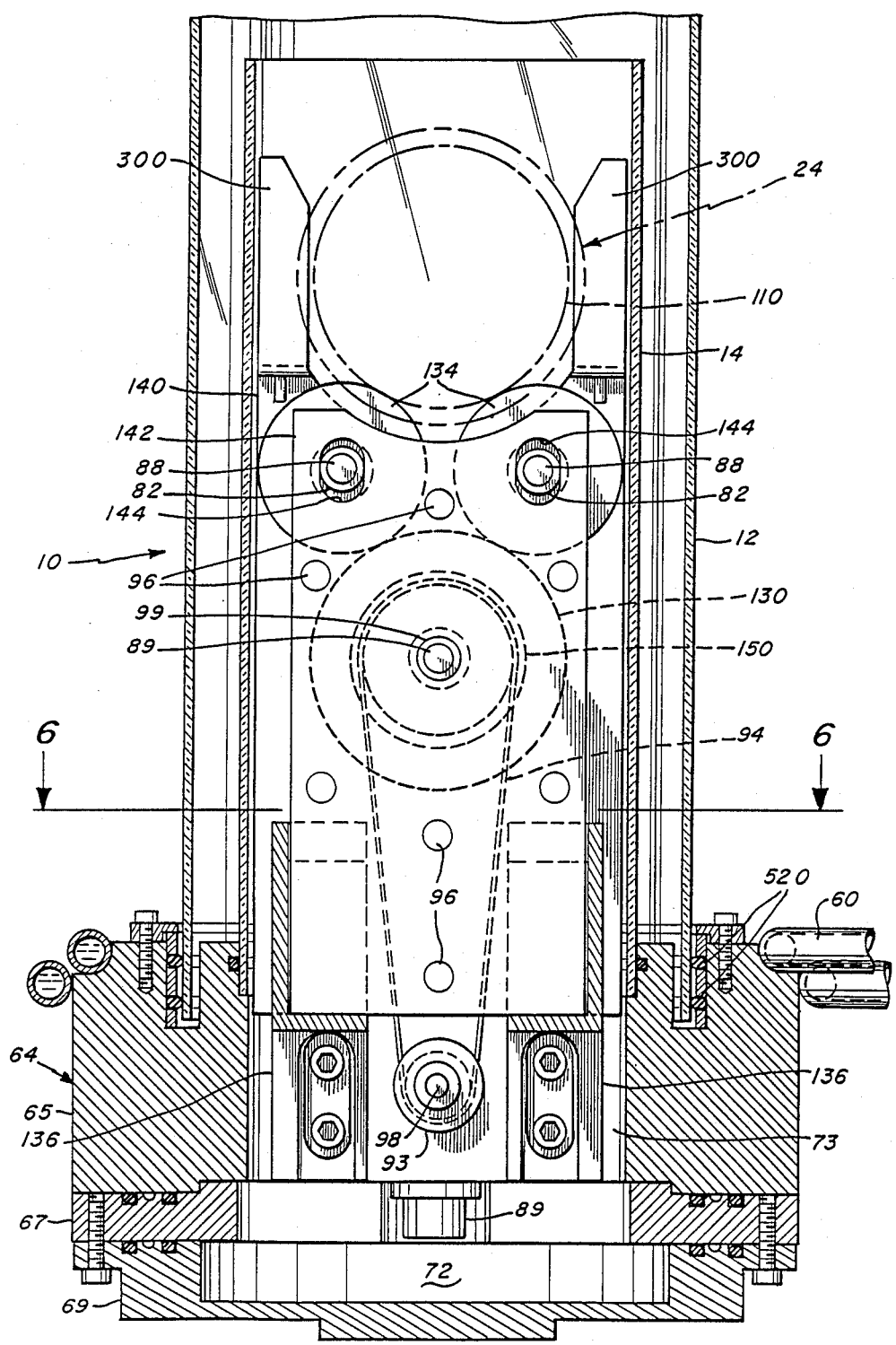
FIG. 5 is a cross-sectional view taken along lines 5—5 of FIG. 3 showing the drive assembly mechanism.

Referring now to FIGS. 5 and 7, the drive wheel assembly details will be described. Note that two such identical drive wheel assemblies are provided, one each on the left and right sides of the intermediate region formed between reactor tubes 14 and 16. An opening 86 is provided in each of the longer side wall 16a of inner reactor tube 16. Intermediate driven wheels 134 are positioned at the lower peripheral extremity of the opening 86 in the inner reactor tube 16. As shown more clearly in FIG. 5, the intermediate driven wheels 134 are rotatably supported in axles 88 on bearings 82 and are driven by drive wheel 130 mounted on axle 89. Bearings 82 are supported in elongated slots 144 which allow drive wheels 134 to float on drive wheel 130. This allows the weight of susceptor 24 to be directly transferred through driver wheels 134 to the surface of drive wheel 130 creating the necessary friction to transfer the rotational force of drive wheel 130 through driver wheels 134 to susceptor 24. A drive wheel pulley 150, shown in dotted lines in FIG. 5, is formed integral with drive wheel 130. Each of these wheels is preferably made of transparent quartz material. Axle 89 is supported by bearing 99. Drive wheel pulley 150 is rotated by wire drive belt 94 which is rotated by drive pulley 93 rotatably mounted on drive shaft 98. Drive assembly support brackets 136 secure the drive assembly to lower plate assembly ring 65.

Support brackets 136 support inner and outer drive assembly support plates 142 and 140, respectively, which vertically support the drive wheel assembly on inner and outer sides thereof. The outer drive assembly support plate and inner drive assembly support plate are oppositely disposed and spaced apart by spacers 96. Left and right belt tensioning screws 89, one of which is shown in FIG. 7, are provided below spring tensioning block 92 through which motor shaft extension 90 couples drive motors 45 (shown in FIG. 1) via flexible coupling 91 to shaft 98, which drives drive pulley 93.

When right and left susceptor assemblies 24R and 24L are lowered through gate valve 40 into the reaction chamber by crane assembly 20 (See FIG. 1), an outer groove 110 on each susceptor assembly rests on the intermediate driven wheels 134 and each susceptor assembly is held in a vertical position by guide fingers 300. Thus, the drive assembly rotates each susceptor assembly with the wafer or chip 100, vertically mounted therein, about an axis transverse or perpendicular to the longitudinal axis of the reaction chamber.

IV. SUSCEPTOR ASSEMBLY

The susceptor assembly details will now be described in connection with FIGS. 8–10 which depict a susceptor assembly 24 adapted for rectangular-type chips 100. The left and right susceptor assemblies 24L and 24R are identical, so only one will be described below and labelled 24. The susceptor assembly comprises a susceptor 124 made of graphite and a plug 102, also made of graphite. Susceptor 124 comprises a relatively large disc having an outer diameter of about 2.5", or larger, depending upon the diameter of envelope 12.

Surface 24a of susceptor 24 is the surface facing the inner reaction region $R_{in}$. An opening 400 is formed in this surface with beveled sides 106. A recessed lip 112 is formed on the elongated sides of the opening 400. The chip or substrate wafer 100 is disposed against the lip.

Threaded plug 102 is screwed into the substrate 124 until it abuts the innermost chip surface, holding the chip firmly in place against the lip 112 within the substrate 124. A circular groove 104 is provided about the periphery of the plug handle 101. The fingers 25 of the crane assembly (See FIGS. 17 and 18) are adapted to grip the plug 102 by being inserted into the grooves 104 of the plug. Recessed circular grooves 110, about the outer periphery of susceptor 24, are provided, within which the driven wheels 134 of the drive assembly mate with the susceptor.

Figure 12:
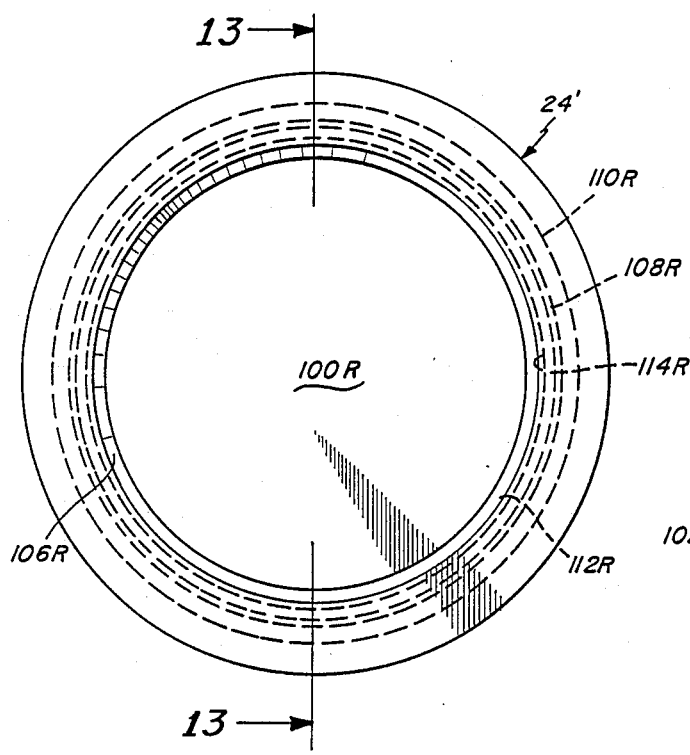
FIG. 12 is a front elevational view of a round chip susceptor 24R and chip 100R of the invention.
Figure 13:
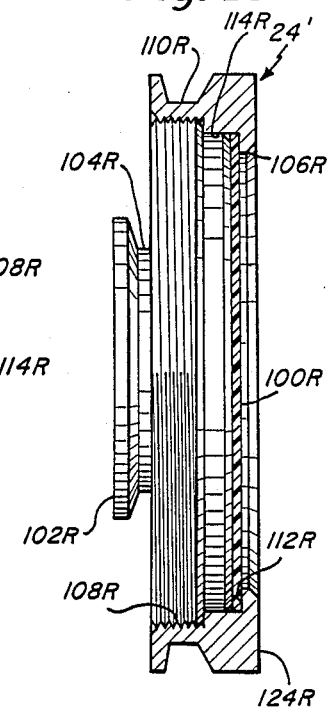
FIG. 13 is a cross-sectional view taken along lines 13—13 of FIG. 12.

FIGS. 12 and 13 show a susceptor assembly 24' for a circular or round chip 100R. In FIGS. 12 and 13, like numerals are used for similar parts in FIGS. 8–11 with the suffix "R" standing for round. Thus, it may be seen that in the susceptor assembly 24' of FIGS. 12 and 13, the assembly is substantially similar to the rectangular chip susceptor assembly 24, except that a circular lip 112R is provided on the inner recessed surface 114R of the susceptor 24R, against which a round chip 100R rests and is held in place by plug 102R.

Figure 12A:
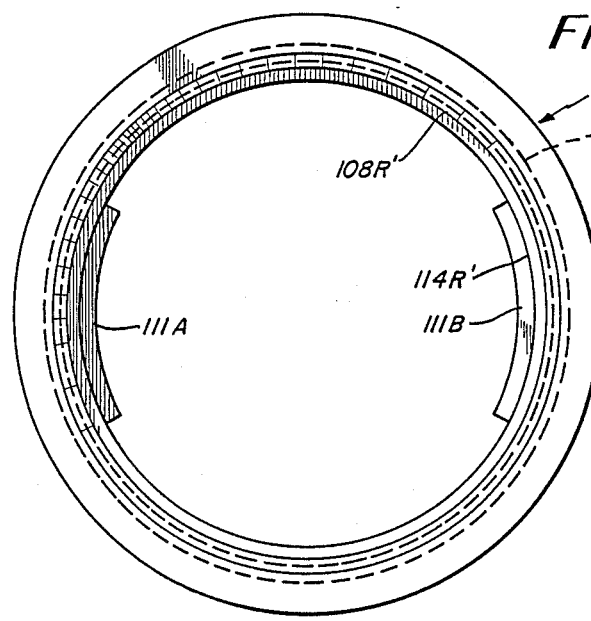
FIG. 12A is a back elevational view of an alternate embodiment of a round chip susceptor 24" of the invention.

In the alternate embodiment of FIG. 12A, the round recessed lip 112R of the susceptor 24" is replaced by a pair of tabs 111A and 111B against which the substrate is held in place by the susceptor plug which is threaded onto threads 108R'.

IV. CRANE ASSEMBLY AND GATE VALVE

The crane assembly and gate valve details will now be described in connection with FIGS. 1 and 14–18. The crane assembly 20 comprises a pair of jaw mechanisms 26L and 26R, each having opposing arms 26a and 26b which open and close in response to movement of an actuating rod 31 disposed within tube 30. Rod 31 is adapted to extend and retract vertically along the longitudinal axis of rod 31 to displace linkage mechanism 28 causing arms 26a and 26b to rotate inwardly or outwardly about an axis transverse the longitudinal axis of rod 31, in response to vertical displacement of rod 31. Thus, downward displacement of rod 31 causes arms 26a and 26b to rotate inwardly to grasp screw plug 102 of susceptor assembly 24 within the fingers 25 of the crane jaw 26 about the peripheral groove 104 on the screw plug 102. The reverse process occurs upon downward displacement of rod 31.

Linkage mechanism 28 comprises a metallic block having longitudinally extending slots 704 and 702 extending therethrough with linkage pins 700 and 706 extending through respective slots 704 and 702. Pins 700 and 706 also extend through corresponding longitudinally extending slots in each of the arms 26a and 26b of crane arm 26. Thus, with upward movement of linkage rod 31, in response to actuation of the arm by air cylinder 506 (See FIG. 15), the actuating arms move to the closed position shown in FIGS. 14 and 17. Downward displacement of actuating rod 31 results in opening of the arms to the position shown in FIG. 18, releasing the grip of fingers 25 on the screw plug 102 of susceptor 24.

Air cylinder line 36 is adapted to be connected to a source of air to actuate air cylinders 506.

Linkage mechanism 28 is fixed to an end of tube 30 and has an internal slideway 33 in which slide block 29 is engaged. Arms 26 pivot on pin 700 which is mounted on linkage mechanism 28. An elongated clearance slot 704 allows pivot pin 700 to pass through slide block 29 without restricting its motion. Affixed to slide block 29 is a linkage pin 706 which extends through elongated clearance slots 702 in linkage block 28 and engages the diagonally opposed elongate slots 708 and 710 in arms 26a and 26b, respectively. From the "at rest" position of FIGS. 14 and 17, actuation of air cylinder 506 raises rod 31 which urges slide block 29 upward, forcing linkage pin 706 against ramp-like surfaces of slots 708 and 710, forcing arms 26a, 26b to pivot outward opening fingers 25 wide enough to pass around the neck of screw plug 102 of susceptor 24. Release of air pressure to air cylinder 506 results in the downward movement of slide block 29, and the inward swinging motion of arms 26, due to the force of gravity and the reverse of the ramping effect, above described. This results in the fingers 25 gripping the neck of screw plug 102. The amount of the gripping force can be adjusted by means of adjusting screws 39 mounted in actuating blocks 37, which limit downward motion of rods 31 after cylinders 506 is deactivated, and thus controls the position of linkage pins 706 and fingers 25. Actuating blocks 37 are attached to the top of rods 31 and to the piston ends of air cylinders 506 which are clamped in blocks 34 screwed to the attaching blocks 35 welded to the uppermost ends of tubes 30.

Each of the outer tubes 30 of the crane assembly are affixed to mounting bracket 32, which, in turn, is affixed to crane bracket 524, mounted on pivot shaft 520 by linear bearings 512. Shaft 520 is pivotably mounted on the gate valve assembly 40 by means of thrust bearing 516 and roller bearings 518. Air cylinder 508 is likewise mounted on gate valve assembly 40 and is adapted to extend and retract air piston 510 in the vertical longitudinal direction of the air piston axis.

Air piston 510 is affixed to crane bracket 524 whereby each of the crane jaws 26 may be raised and lowered when the air piston 510 is vertically extended or retracted, respectively. An aligning hole 522 is provided on crane bracket 524 which mates with an aligning pin 22 on the upper base of gate valve assembly 40, so that precise alignment of the crane arm jaws 26, and hence the susceptor assembly 24, onto the driven wheels 134 of the drive assembly (located within the reactor below the opening 650 in the gate valve) is provided.

Figure 14:
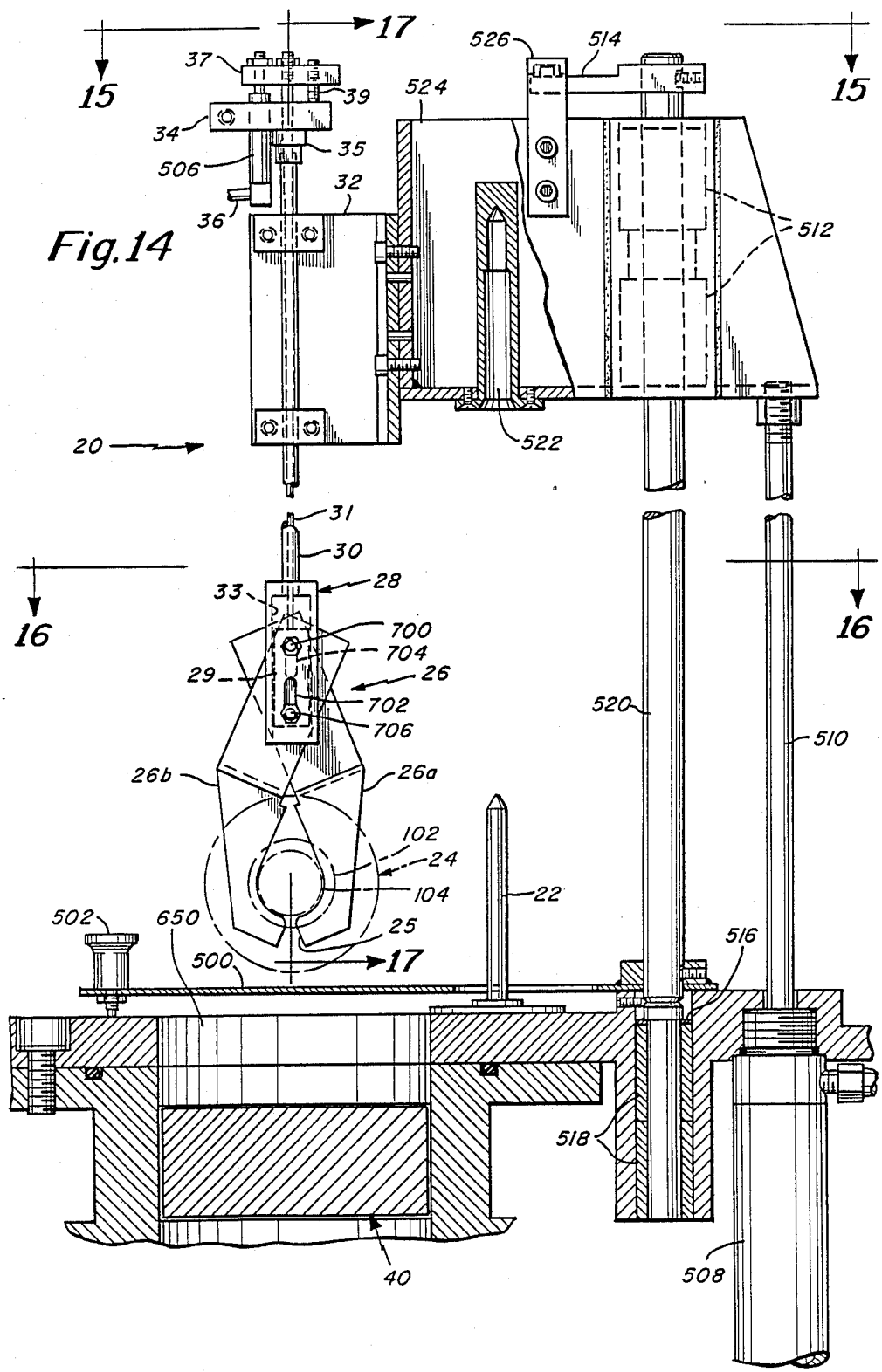
FIG. 14 is a cross-sectional view taken along line 14—14 of FIG. 1 showing the details of the crane assembly 20 of the invention.
Figure 15:
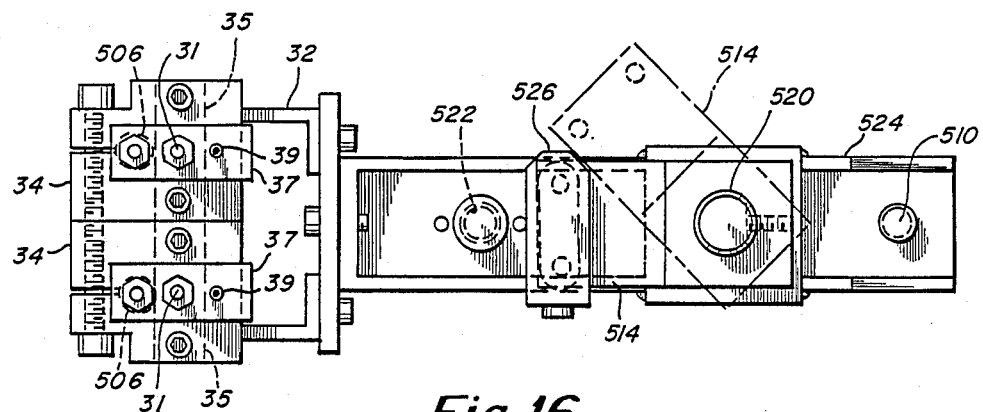
FIG. 15 is a top view of the crane assembly taken along lines 15—15 of FIG. 14.
Figure 16:
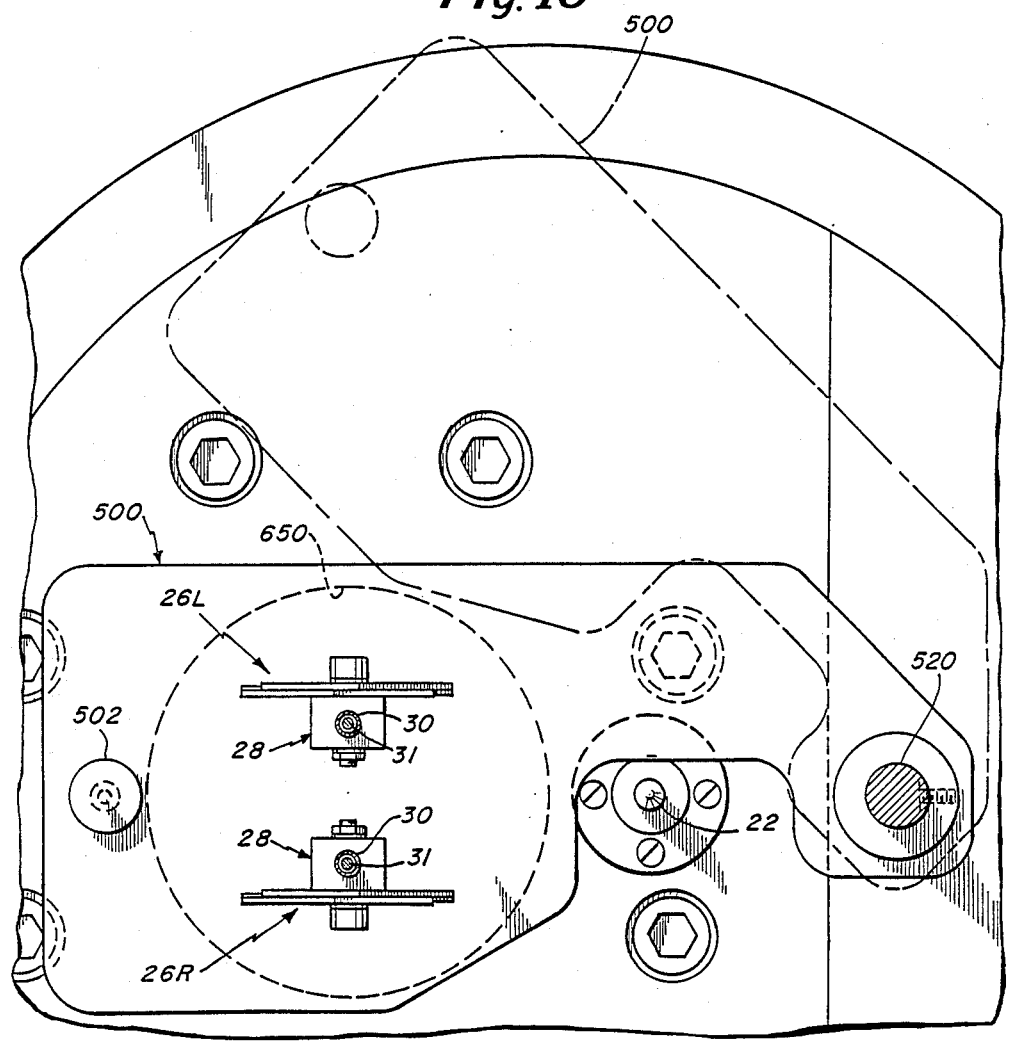
FIG. 16 is an enlarged partial view, taken along line 16—16 of FIG. 14, of the gate valve and cover plate mechanism 300 of the invention.

Latch bracket 526, mounted on crane bracket 524, in combination with crane latch 514, mounted on pivot shaft 520, holds the crane jaws 26 in the latched position shown in FIG. 14 when the air cylinder 508 is de-energized. Cover plate 500 is provided with a knob 502 for manually azimuthal rotation of the cover plate in a plane transverse the longitudinal axis of the reactor 10. When the cover plate is rotated, as shown by the dotted lines in FIG. 16, an opening 650 is exposed into the gate valve assembly 40 and through the gate valve assembly 40 to the inner reactor. Manual rotation of cover plate 500 also rotates pivot shaft 520 and crane latch 514 to the position shown in dotted lines in FIG. 15 releasing the crane assembly 20 for vertical downward movement into the opening 650 into the reactor chamber.

VI. SYSTEM OPERATION

The operational aspects of the system will now be explained in detail in connection with FIGS. 3, 6 and 7. CVD reaction gasses, typically, in the case of MOCVD; TMG, TEG, or other organo-metallic vapors, transported in hydrogen are injected into the reactor 10 from the inlet port 44 through the lower cover plate through transverse bore 45T, longitudinal bore 45L into gas manifold 70, then through holes 470 in gas dispersion plate 47 (See FIG. 3) to form a substantially one-dimensional line of reaction gas. The gas flows up the slightly funnelled area or region $R_F$ within inner reactor tube 16 until it reaches the generally rectangular cross-section of the center part of the quartz inner reactor tube 16. The gas then passes between the two graphite susceptor assemblies 24R and 24L carrying wafers or chips 100 vertically mounted thereon. The chips are thereby exposed to the flow of gas via openings in the vertical long walls 16a of inner reactor tube 16.

The gas is heated by thermal energy radiated from the susceptors which are inductively heated by R.F. coils 910 encircling the reactor envelope 12 adjacent the susceptors 24. The reactor gasses are partially decomposed, or pyrolized, and reactant deposits, such as GaAs, GaP, InP or InGaAsP form amorphous, or epitaxial layers, on the surface of wafers 100. Any undeposited gaseous by-products are deflected by deflector 80 which turns the gas away from a vertical flow into a slightly horizontal turbulent flow. The deflected gas passes over the intermediate section $R_{int}$ of the reactor which is provided with clean hydrogen gas from lower inlet port 46 and from above via inlet port 42 (See FIG. 2). The clean $H_2$ purge gas from port 42 maintains clean flow of gas against the gate valve and above the deflector. The clean hydrogen purge gas from port 46 maintains a positive pressure to prevent the reaction by-products from flowing down into the intermediate region $R_{int}$ and contaminating the drive mechanism for the susceptors which are housed in intermediate region $R_{int}$. Instead, the reaction by-products are exhausted vertically downward through outer region $R_o$ to the lower base plate 64 through openings 52A and B and 58A and B which are manifolded together via lines 56 and 58 coupled to exhaust manifold 54 (See FIG. 1).

Figure 19:
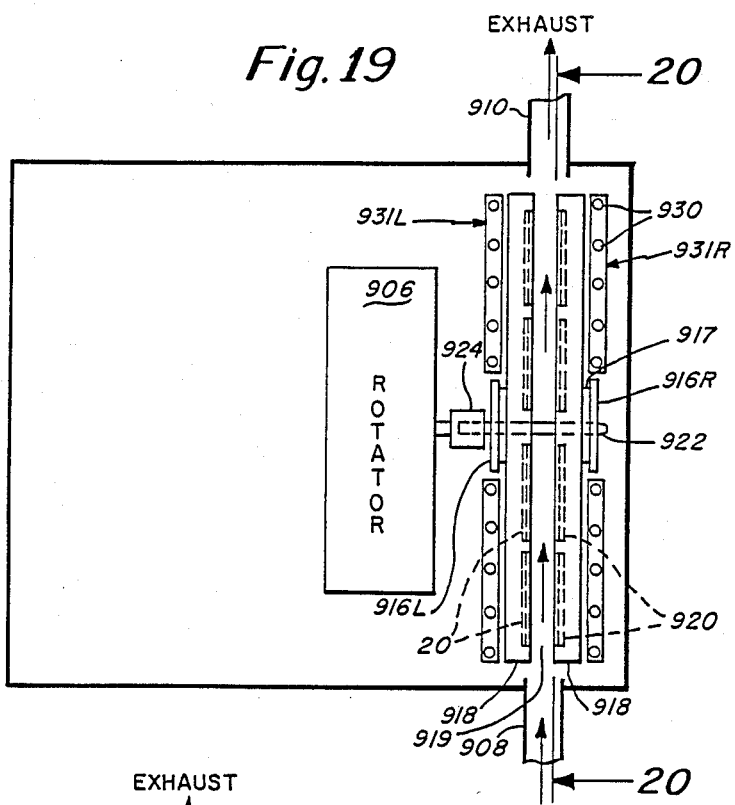
FIG. 19 is a side-elevational schematic view of an alternate side loading embodiment of the invention.
Figure 20:
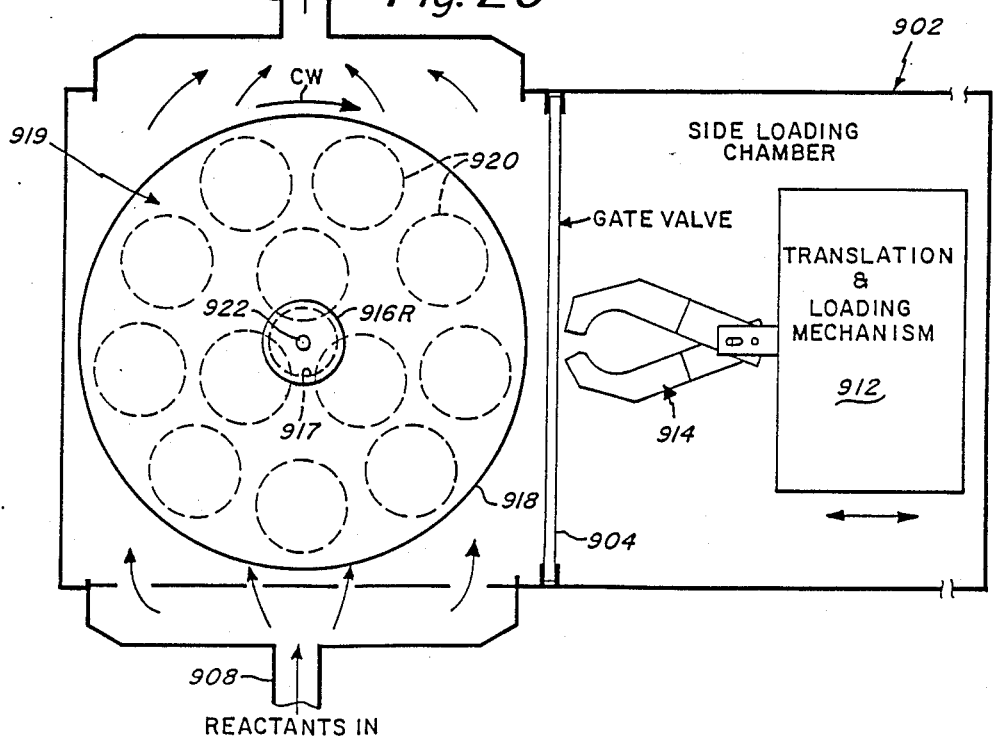
FIG. 20 is a front elevational view along lines 20—20 of FIG. 19.
Figure 21:
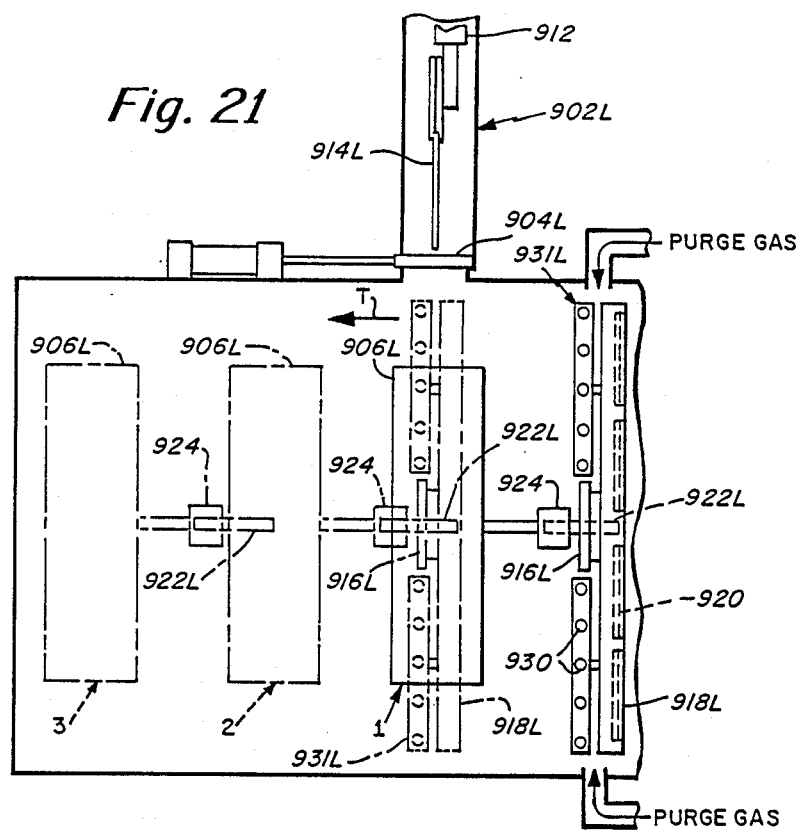
FIG. 21 is a top view of the embodiment of FIG. 19.

In the alternate embodiment of FIGS. 19-21, shown in partial schematic form, the diameter of the susceptors has been enlarged to accommodate many substrates and the exhaust mechanism has been relocated above the reaction zone; while separate loading and unloading mechanisms are located adjacent a narrow side of the reaction zone.

In this embodiment, inlet port 908 couples reaction gasses into the bottom of a reaction zone 919 formed between two separate opposing rotatable susceptors 918L or 918R, centrally mounted on left and right axles 922L and 922R. A plurality of round substrate wafers 920 (twelve 3" wafers) are mounted on each of two large susceptors 918L or 918R having an outer diameter of 13 inches or more with opposite exposed surfaces of the wafers facing the upward flowing gas reaction stream in zone 919. The large susceptor diameter and small gap of about $\frac{1}{2}$ inch between susceptors/substrate surfaces provides an extremely high aspect ratio, in the order of 13:0.5 or 26. Exhaust gasses exit through port 910. A pair of pancake-type heaters 931L and 931R having spiral heater coils 930 are mounted, one each, adjacent and attached to each susceptor for bringing the susceptors to the reaction temperature.

The substrates 920 may be mounted in the susceptor 918, as in previous embodiments. The details need not therefore be shown here. Removable left and right grasping plugs 916L and 916R are fixed, as by threading, to the respective left and right susceptors and are formed with peripheral grasping grooves 917.

A pair of rotators 906L and 906R, comprising a motor and gear train and stepped translation mechanism, is coupled to respective left and right axles 922L and 922R by couplers 924. The rotators rotate the susceptors clockwise in the direction of the arrow "CW" so that the substrates 920 are alternately moved downwardly and upwardly in the upwardly flowing path of reactant gasses.

Side-loading chambers 902 (Note: For simplicity, only one such chamber 902L is shown in FIGS. 20 and 21, it being understood that the right side broken away in FIG. 20 is the mirror image of the left side, as in FIG. 22) adjacent a narrow wall of the reactor zone are provided with a gate valve mechanisms 904 through which crane members 914L and 914R may be horizontally translated into and out of chamber 902 by mechanism 912 to pass between the space between the heaters and susceptors to grasp plugs 916L and 916R extending from susceptors 918.

Mechanism 912 operates in conjunction with the stepped positions 1, 2 and 3 (as shown in FIG. 21) of rotators 906L and 906R. Position 1 is the normal rotation position in which the susceptors are rotated during the CVD deposition process. In position 2, the rotators 906L and 906R, axles 922L and 922R, heaters 931L and 931R, and susceptors 918 are translated horizontally to align the susceptors 918 opposite crane members 914R and 914L. Gate valves 904L and 904R are opened, the crane members 914L and 914R are translated horizontally to grasp plugs 916L and 916R. Next, the rotators 906L and 906R are translated to position 3 releasing axles 922L and 922R from the susceptors so that they can be withdrawn into loading chambers 902L and 902R by translation mechanisms 912 in each of chambers 902L and 902R. During this process, pancake heaters 931R and 931L move with the respective susceptors.

Figure 22:
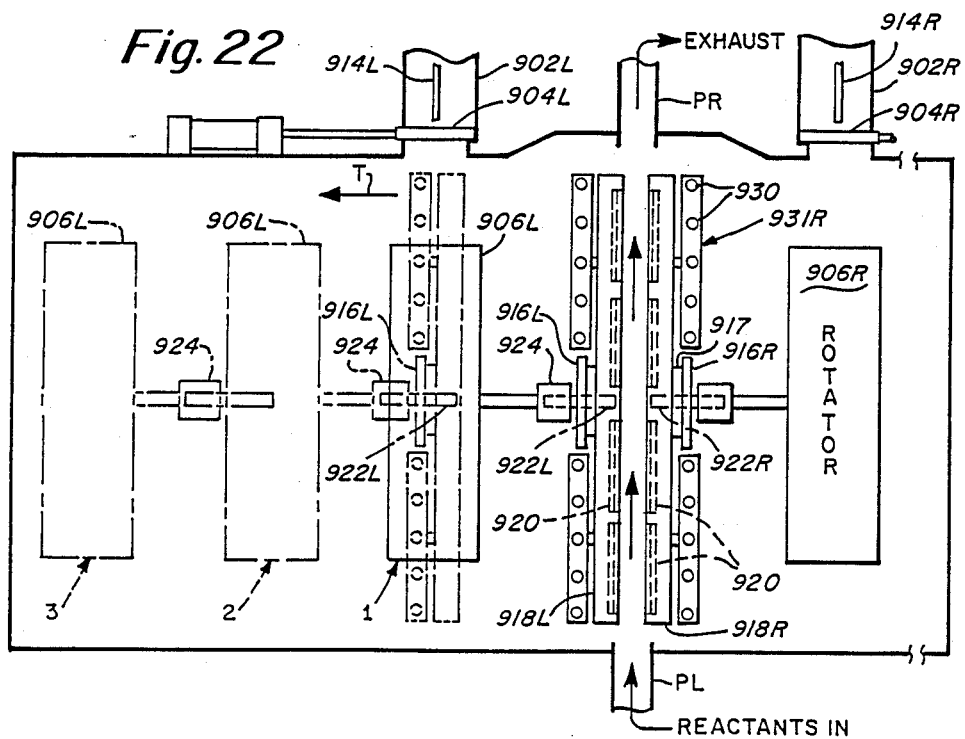
FIG. 22 is a top view of an alternate embodiment of the embodiment of FIGS. 19-21.

It is contemplated that the high aspect ratio apparatus may also find useful application in modified vertical reactors wherein the gaseous reactants are introduced at cross-direction to the wafers, as shown in FIG. 22. In FIG. 22, reactor gasses enter through left port PL at one side of the reaction chamber and are exhausted at the other side through port PR, rather than being introduced at the bottom of the chamber, as in FIG. 19. Alternatively, the reactant gasses may flow diagonally across the substrate by introducing them at a lower side wall and exhausting at a diagonally adjacent port in an opposite side wall.

EQUIVALENTS

The embodiments described herein are the presently preferred embodiments of the vertical OMCVD reactor of the invention constructed in accordance with the principles of the present invention. However, it is understood that various modifications may be made to the embodiments described herein by those skilled in the art without departing from the scope of the invention, as defined by the claims hereinafter set forth. For example, while pairs of rotatable susceptors are utilized in the described embodiments, it is contemplated that a single non-rotatable susceptor may be utilized in connection with the high aspect ratio reaction chamber of the invention. In this specific case, the aspect ratio would be defined by the ratio of the lateral width or, in the case of round susceptors, the diameter of the susceptors over the distance between opposing susceptors. Preferably, an aspect ratio of at least 3 is contemplated. Radiant heat from IR Lamps may be used in place of the R.F. coils of the invention.

We claim:

1. A chemical vapor deposition system for depositing a reactant from a flowing reactant gas introduced into a reactant chamber on a substrate mounted on a susceptor in said chamber comprising:
   (a) a reaction chamber for heating reacting gasses by a pair of opposing heatable susceptors to deposit a reactant from said gasses on said substrate as said gasses are heated and pass to a region beyond said susceptors; and
   (b) the space between said suspceptors forming a reaction region at least one of said susceptors having means for mounting a substrate thereon with the substrate having an exposed surface facing the reaction region for deposition of said reactant on said exposed surface, the ratio of the lateral width of said susceptors transverse the direction of flow of reacting gasses to the distance between said opposing susceptors being greater than one;
   (c) rotator means for solely rotating at least one such susceptor with the substrate about an axis transverse the flow of reactant gasses; and
   (d) exhaust means for exhausting reactant gasses.

2. Apparatus for heating gasses in a chamber to obtain a reaction comprising:
   (a) a reaction chamber for heating reacting gasses with a heated susceptor and wherein the main flow of the reacting gasses is in a vertical direction from a lower inlet port to a higher outlet port past said susceptor, said susceptor having a front broad surface and a rear broad surface extending in the plane of the flow of the reacting gasses with the front surface being closest to the main flow of reacting gasses and having an opening therein extending in a longitudinal direction transverse the flow of the reacting gasses past the susceptor;
   (b) a substrate being mounted through the rear surface on the broad surface of said susceptor through the opening therein and having an exposed surface parallel to the vertical main flow of gasses upon which surface reactants from the reacting gasses are deposited by chemical vapor deposition;
   (c) rotator means for rotating said susceptor and said substrate solely about an axis transverse the vertical direction of flow of the reactant gasses through a reaction region opposite the susceptor surface.

3. The system of claim 1 including access means for loading and unloading the susceptor with the substrate form said chamber.

4. The system of claim 3 wherein the access means includes a crane means disposed adjacent one vertical end of said chamber for grasping the susceptor to be removed.

5. The system of claim 3 wherein the access means includes means disposed horizontally adjacent the space between substrates for grasping the susceptor to be removed.

6. Reaction apparatus for chemical vapor deposition of heated reactants on substrates comprising:
   (a) an enclosed vertically extending envelope;
   (b) a heated reaction zone within said envelope wherein deposition of reactants on said substrates occurs from heated reactants which flow from a lower region through said reaction zone to an upper region; one side of said zone being formed by a first susceptor for heating said reaction zone upon which is mounted at least a first substrate with a planar surface exposed to said reaction zone upon which surface said reactants are deposited, and an opposite side of said zone being formed by a second susceptor also for heating said reaction zone and upon which is mounted at least a second substrate with a planar surface exposed to said reaction zone also upon which surface said reactants are deposited, said susceptors having a length dimension extending vertically and a width dimension extending laterally transverse the vertically extending envelope, the ratio of the width of said susceptor to the distance between opposite exposed substrate surfaces being greater than one;
   (c) mean for rotating said susceptors solely about an axis transverse the flow of heated reactants.

7. The apparatus of claim 6 including means for loading and unloading said susceptors from one vertical end of said envelope.

8. The apparatus of claim 6 including means for loading and unloading said susceptors from one adjacent side of said envelope.

9. Reaction apparatus for chemical vapor deposition of reactants on a substrate comprising:
   (a) an outer walled envelope extending in a vertical direction and having an enclosing side wall structure and two end walls;
   (b) an inner walled partition within said envelope for defining an innermost region between said inner walled partition wherein a main flow of reactant gasses is established in an upwardly direction; and
   (c) at least two susceptors disposed in the partition, with a substrate mounted on at least said susceptor and having an external surface exposed to said main flow of reactant gasses as they pass from a lower region to an upper region, said susceptor holding said substrate for rotational movement solely in a plane substantially parallel to the main upward flow of reactant gasses.

10. The chamber of claim 9 wherein a drive mechanism for rotating said susceptor is contained in a intermediate region formed between said inner walled portion and an outer walled portion spaced from said outer walled envelope and purge gasses flow from one end of said intermediate region to the other end.

11. A reactor for depositing material on a substrate comprising:
   (a) an outer tubular envelope having first and second opposing end plates, said envelope extending about a longitudinal axis;
   (b) inner and outer reactant tubes extending in said longitudinal plane within said envelope and coaxial to the longitudinal axis of said envelope;
   (c) the longitudinally extended region between said outer reactor tube and said envelope comprising an exhaust region, the longitudinally extended region between said inner reactor tube and said outer reactor tube comprising a purge gas region and the region within said inner reactor tube forming a reaction gas flow region;

(d) a pair of oppositely disposed disc-like susceptors for heating reaction gasses in the reaction gas flow region as such gasses flow upwardly disposed within said purge gas region at least one such susceptor holding at least one substrate with the deposition surface of said substrate exposed to said reaction gas flow region and aligned in a plane parallel to the axial plane of the envelope, the ratio of the outer diameter of said susceptors to the distance between opposite deposition surfaces, one such surface being the said substrate surface and the other being an exposed susceptor surface, being greater than one; and (e) port means for introducing reaction gas into said reaction gas region from below the susceptors;

(f) drive means for rotating the susceptor holding the substrate solely about an axis transverse said longitudinal axis.

12. A reaction chamber for chemical vapor deposition of reactants from reactant gasses on heated substrates comprising:

(a) an outer walled envelope having an enclosing side wall and two end walls;

(b) an intermediate walled partition within said envelope defining a outermost region between said intermediate partition and said enclosing side wall wherein reactant by-products are exhausted;

(c) an inner walled partition within said intermediate partition defining with said intermediate walled partition an intermediate region between said intermediate partition and said inner walled partition and defining an innermost region within said inner walled partition wherein a flow of reactant gasses is established vertically upwardly from a lower region to an upper region;

(d) at least two susceptors disposed in the intermediate region, with said substrates mounted on said susceptors and having an external surface exposed to said upward flow of reactant gasses for heating said reactant gasses to cause said gasses to dissociate and form reactant products on both substrates, said susceptors holding said substrates for rotational movement solely in a plane substantially parallel to the flow of reactant gasses;

(e) heater means for heating said susceptors.

13. The chamber of claim 12 wherein a drive mechanism for rotating said susceptors is contained in said intermediate region and a flow of purge gasses flow from one end of said region to the other end.

14. A reactor for depositing semiconductor material on a substrate comprising:

(a) an outer tubular envelope having first and second opposing end plates, said envelope being adapted to be mounted in a longitudinally extending vertical plane;

(b) inner and outer reactant tubes extending in said longitudinal plane within said envelope and coaxial to the longitudinal axis of said envelope;

(c) the longitudinally extended region between said outer reactor tube and said envelope comprising an exhaust region, the longitudinally extended region between said inner reactor tube and said outer reactor tube comprising a purge gas region and the region within said inner reactor tube forming a reaction gas flow region wherein reactant gas flows mainly from a lower zone to an upper zone and is exhausted through said exhaust region;

(d) a pair of oppositely disposed susceptor means disposed within said purge gas region for creating a heated reaction zone within said gas flow region, said zone having an aspect ratio of greater than one, wherein the aspect ratio is defined as the ratio of the width lateral to the longitudinal axis of the susceptor means versus the space between the susceptor means, one of said susceptor means also holding said substrate with the deposition surface of said substrate exposed to said reaction gas flow region and aligned in a plane substantially parallel to the axial plane of the envelope, such that reactant gas heated by said susceptor means react and material from said gas deposits on said substrate;

(e) means for rotating said susceptor means solely about an axis transverse the gas flow.

15. The reactor of claim 1 wherein each susceptor comprises a disc having a circular periphery and the ratio of the diameter of the discs to the distance between adjacent susceptors is substantially greater than one.

16. The reactor of claim 15 wherein at least 9 substrates are mounted on each susceptor and the ratio is 3 or greater.

17. The apparatus of claim 1 wherein the susceptor comprises a heatable disc having a transverse bore extending therethrough with an internal peripheral projection at one end of the bore against which said substrate is held by a plug extending into said bore.

18. The apparatus of claim 1 wherein said susceptor means are cradled on a drive mechanism in the purge gas region and including crane means for grasping said plug about the periphery thereof for lowering and removing said susceptors from said drive mechanism.

19. The apparatus of clam 11 including a diffuser plate for diffusing the reaction gas before it enters the reaction gas region.

20. The system of claim 1 wherein the chamber is a vertical type chamber and reactant gasses are introduced from below the susceptors and flow upwardly between the susceptors.

21. The system of claim 1 wherein the chamber is a vertical type chamber having opposing side walls extending along a vertical axis and reactant gasses are introduced from opposite sides of the sidewalls of the chamber by port means located on said sidewalls and flow cross-wise transverse the vertical axis between the two susceptors.

22. A CVD system for depositing films from reacting gasses on wafers comprising:

(a) a vertical walled chimney-type reaction chamber for heating said reacting gasses with heated susceptors displaced from the chamber walls which reacting gasses flow vertically from below said susceptors to a region above said susceptors;

(b) a pair of wafers mounted in the susceptors, one each on adjacent sides of said susceptors so that material from said heated reaction gasses deposits films on each wafer, the ratio of the width of said susceptors across the chamber to the distance between opposite adjacent wafers being greater than one;

(c) rotator means for rotating said susceptors solely about an axis transverse the flow of reacting gasses;

(d) exhaust means for exhausting reactant gasses; and (e) access means for loading and unloading said susceptors from said chamber.

23. The system of claim 22 wherein the access means is disposed adjacent one vertical end of said chamber for grasping said susceptors through an interlock gate valve.

24. The system of claim 22 wherein the access means is disposed horizontally adjacent the space between wafers for grasping the susceptors through a gate valve.

25. Reaction apparatus for chemical vapor deposition of heated reactants on a substrate surface comprising:
    (a) an enclosed extended envelope;
    (b) a reaction zone within said envelope wherein reactant gas is heated by a pair of opposed susceptors, each having a planar wall surface facing the other susceptor and said heated gas flows mainly from a region below said susceptors vertically in a path which is generally parallel to the planar opposed walls of said susceptors to a region above said susceptors, one side of said zone being formed by a wall of a first susceptor upon which is mounted at least a first substrate with a planar surface exposed to said reaction zone, and an opposite side of said zone formed by a wall of separate second susceptor; and
    (c) rotator means for rotating said susceptors solely about an axis transverse the flow of heated reactants.

26. The apparatus of claim 25 wherein the susceptors are generally circular in shape and a plurality of wafers are mounted on each susceptor.

27. The apparatus of claim 25 wherein the ratio of the width of said susceptors transverse the vertical flow of reactant gas to the distance between said susceptors being about 3 or greater.

28. The apparatus of claim 25 wherein the distance between susceptors is less than or equal to about one inch.

29. The apparatus of claim 28 wherein the lateral width of the susceptors is greater than about two inches.

30. The apparatus of claim 25 wherein a diffuser plate is provided adjacent the reaction zone to enable a flow of reactant gasses into the reaction zone which is initially greater at the outer extremities of the zone than at the central inner core thereof.

31. The apparatus of claim 25 wherein the substrate is mounted on said susceptor through an opening formed in said susceptor on a back wall thereof opposite the susceptor wall forming one side of said reaction zone.

32. A reactor for depositing semiconductor material from a heated reaction gas on a substrate comprising:
    (a) an outer tubular envelope having first and second opposing end plates, said envelope being adapted to be mounted in a longitudinally extending vertical plane;
    (b) inner and outer reactant tubes extending in said longitudinal plane within said envelope and coaxial to the longitudinal axis of said envelope;
    (c) the longitudinally extended region between said outer reactor tube and said envelope comprising an exhaust region, the longitudinally extended region between said inner reactor tube and said outer reactor tube comprising a purge gas region and the region within said inner reactor tube forming a reaction gas flow region wherein said reaction gas flows from a lower region upwardly;
    (d) a pair of susceptors for heating said reaction gas disposed within said purge gas region, each susceptor comprising a heatable disc having a transverse bore extending therethrough with an internal peripheral projection at one end of the bore against which said substrate is held by a plug extending into said bore, such that, the deposition surface of said substrate is exposed to said reaction gas flow region and aligned in a plane parallel to the axial plane of the envelope and the upward flow of reaction gas; the ratio of the lateral width of said susceptors transverse the longitudinal axis to the distance between susceptors being greater than one;
    (e) and a drive mechanism upon which said susceptors are cradled in the purge gas region and including crane means for grasping said plug about the periphery thereof for lowering and removing said susceptors from said drive mechanism.

33. The system of claim 2 wherein the rotator means is located horizontally adjacent said susceptor to directly rotate said susceptor;
    access means horizontally adjacent said susceptor to provide access to said susceptor;
    grasping means adjacent said access means and horizontally translatable with respect to grasping said susceptor for introducing and removing said susceptor from said chamber;
    and means for releasing and engaging said rotator means from or with said susceptor to permit said susceptor to be removed or driven, respectively.

34. The system of claim 32 including resistance heating means mounted on said susceptor.

* * * * *

UNITED STATES PATENT AND TRADEMARK OFFICE
CERTIFICATE OF CORRECTION

PATENT NO. : 4,839,145
DATED : June 13, 1989
INVENTOR(S) : Ronald P. Gale and John C. C. Fan It is certified that error appears in the above—identified patent and that said Letters Patent is hereby corrected as shown below:

Col. 13, line 58, delete "form" and insert ---from---.

Col. 14, line 49, delete "a" and insert ---an---.

Col. 15, line 26, delete "a" and insert ---an---.

Signed and Sealed this

Thirteenth Day of March, 1990

Attest:

JEFFREY M. SAMUELS

*Attesting Officer*  *Acting Commissioner of Patents and Trademarks*